United States Patent
Wang et al.

(10) Patent No.: US 10,312,316 B2
(45) Date of Patent: Jun. 4, 2019

(54) DISPLAY APPARATUS AND METHOD OF MANUFACTURING THE SAME, PACKAGE COVER PLATE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yulin Wang, Beijing (CN); Li Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/713,465

(22) Filed: Sep. 22, 2017

(65) Prior Publication Data

US 2018/0083086 A1    Mar. 22, 2018

(30) Foreign Application Priority Data

Sep. 22, 2016  (CN) .................... 2016 2 1072503 U

(51) Int. Cl.
| | |
|---|---|
| H01L 27/32 | (2006.01) |
| H01L 51/52 | (2006.01) |
| H01L 51/56 | (2006.01) |
| G02F 1/1335 | (2006.01) |
| H01L 29/08 | (2006.01) |
| H01L 35/24 | (2006.01) |
| H01L 51/00 | (2006.01) |

(52) U.S. Cl.
CPC ........ *H01L 27/3276* (2013.01); *H01L 51/524* (2013.01); *H01L 51/56* (2013.01); *G02F 1/133603* (2013.01); *H01L 27/3225* (2013.01)

(58) Field of Classification Search
CPC ... H01L 27/3276; H01L 51/524; H01L 51/56; H01L 51/0097; G06F 3/041
USPC ............... 257/40; 349/58; 361/717–719
See application file for complete search history.

(56) References Cited

U.S. PATENT DOCUMENTS

| | | | |
|---|---|---|---|
| 2002/0051102 A1* | 5/2002 | Kuroki | G02F 1/133308 349/58 |
| 2006/0109614 A1* | 5/2006 | Lee | G02F 1/133308 361/679.21 |
| 2009/0093136 A1* | 4/2009 | Hiew | G06F 1/1632 439/55 |

(Continued)

*Primary Examiner* — Nduka E Ojeh
(74) *Attorney, Agent, or Firm* — McDermott Will & Emery LLP

(57) ABSTRACT

A display apparatus includes a display substrate, a package cover plate on the display substrate, and a plurality of FPCs; at one end of the FPC is a driver IC, and the other end of the FPC is connected to the display substrate; a groove is at the edge of the surface away from the display substrate, and the opening direction of the groove deviates from the display substrate; the groove includes a first groove wall, and a second and third groove walls, wherein the first groove wall is located within the package cover plate and the two sides of which are connected to one side of each of the second and third groove walls, respectively, while the other side of each of the second and third groove walls extends to the edge of the package cover plate.

20 Claims, 3 Drawing Sheets

(56) References Cited

U.S. PATENT DOCUMENTS

| | | | | |
|---|---|---|---|---|
| 2013/0120701 A1* | 5/2013 | Yamazaki | | H01L 27/1225 |
| | | | | 349/138 |
| 2013/0257696 A1* | 10/2013 | Ha | | H01L 27/3276 |
| | | | | 345/76 |
| 2015/0069905 A1* | 3/2015 | Tanahashi | | H05K 1/14 |
| | | | | 313/503 |
| 2016/0320646 A1* | 11/2016 | Lee | | G02F 1/1339 |
| 2017/0040569 A1* | 2/2017 | Watabe | | H01L 27/3244 |

* cited by examiner

DISPLAY APPARATUS AND METHOD OF MANUFACTURING THE SAME, PACKAGE COVER PLATE

CROSS-REFERENCE TO RELATED APPLICATION

This application claims priority to Chinese Patent Application No. 201621072503.0, filed on Sep. 22, 2016, titled "DISPLAY APPARATUS AND PACKAGE COVER PLATE", which is incorporated herein by reference in its entirety.

TECHNICAL FIELD

The disclosure relates to the technical field of display, more particularly, to a display apparatus and method of manufacturing thereof, package cover plate.

BACKGROUND

Typically, the display apparatus comprises a display substrate, a package cover plate arranged on the display substrate and a plurality of Flexible Printed Circuits (for short, FPC). One end the FPC is connected to the display substrate in a manner of reverse bonding, and on the other end of the FPC there is arranged an Integrated circuit (for short, IC) for driving the display substrate for displaying contents. And the other end of the FPC on which the driver IC is attached is located on the package cover plate.

SUMMARY

An object of the disclosure is providing a display apparatus and a method manufacturing thereof and a package cover plate, which is capable of protecting the FPC under the premise of not increasing the thickness of the display apparatus.

In order to achieve the object, the embodiments of the present disclosure adopt the following technical solutions.

A first aspect of the disclosure provides a display apparatus, which comprising a display substrate, a package cover plate arranged on the display substrate, and a plurality of FPCs (Flexible Printed Circuit), at one end of the FPC there being arranged a driver IC, and the other end of the FPC being connected to the display substrate, wherein a groove is arranged at the edge of the surface that is far away from the display substrate of the package cover plate, and the opening direction of the groove deviates from the display substrate; the groove comprises a first groove wall, and a second and third groove walls which are arranged oppositely, the first groove wall is located within the package cover plate and the two sides of which are connect to one side of each of the second and third groove walls, respectively, and the other side of each of the second and third groove walls extends to the edge of the package cover plat, respectively; the end of the FPC on which the driver IC is arranged is located within the groove.

As for the display apparatus of the present disclosure, the package cover plate is arranged on the display substrate, and a groove is arranged at the edge of the surface that is far away from the display substrate of the package cover plate; the groove has three groove walls, wherein the first groove wall is located within the package cover plate, while the other two groove walls are arranged oppositely; one side of the second groove wall is connected to one side of the first groove wall, and the other side of the second groove wall extends to the edge of the package cover plate, accordingly, one side of the third groove wall is connected to the other side of the first groove wall, and the other side of the third groove wall also extends to the edge of the package cover plate; it can be seen that, the edge of the package cover plate is located between the second and third groove walls, and there is not any groove wall at the edge of the package cover plate; as a result, the end of the FPC on which the driver IC is arranged can be located within the groove from the side of the groove where there is no groove walls are arranged at the edge of the package cover plate, while the other end of the FPC is connected to the display substrate.

Based on the above explanation, on one hand, the driver IC is arranged in the same position as that of an existing display apparatus when the end of the FPC on which the driver IC is arranged is located on the package cover plate due to the opening direction of the groove deviating from the display substrate, thus there is basically no bad influence about the driver function of the driver IC; on the other hand, there is basically no bad influence about the display effect of the display apparatus due to the groove being arranged at the edge of the package cover plate. Based on the above two hands, it can be seen that the groove for locating the end of the FPC on which the driver IC is attached can be arranged under the premise that there is basically no bad influence about the functions of the display apparatus.

Thus, the thickness of the display apparatus of the disclosure does basically not increase, meanwhile the right-angle-edge of the package cover plate contacting with the FPC becomes thinner due to the groove, so that the force received by the FPC at the position of the right-angle-edge becomes smaller, in turn the FPC is basically not scratched by the right-angle-edge; and it is achieved that the FPC is protected under the premise of not increasing the thickness of the display apparatus.

A second aspect of the disclosure provides a package cover plate, which is applicable for the above display apparatus and comprises a first surface and a second surface arranged oppositely; a groove is arranged at the edge of the first surface, and the opening direction of the groove deviates from the second surface; the groove comprises a first groove wall, and a second and third groove wall which are arranged oppositely, wherein the first groove wall is located within the package cover plate and the two sides of which are connected to one side of each of the second and third groove walls, respectively, while the other side of each of the second and third groove walls extends to the edge of the package cover plate, respectively; the package cover plate comprises a plurality of grooves, the plurality of grooves are arranged around the edge of the first surface.

The benefits and advantages of the package cover plate provided by the disclosure is basically the same as that of the above display apparatus, and it will not go into details here.

A third aspect of the disclosure provides a method for manufacturing the above display apparatus, which comprises: providing with a package cover plate which comprises a first surface and second surface arranged oppositely; locating a cutting line on the first surface of the package cover plate; forming a groove on and across the cutting line, wherein the opening direction of the groove deviates from the second surface, and the groove comprises four groove walls connected in sequence; the groove wall that is close to the edge of the package cover plate and the groove wall that is far away from the edge of the package cover plate are located at each side of the cutting line, respectively; cutting the package cover plate along the cutting line.

The benefits and advantages of the method for manufacturing the above display apparatus provided by the disclosure is basically the same as that of the above display apparatus, and it will not go into details here.

BRIEF DESCRIPTION OF THE DRAWINGS

The accompanying drawings are used to provide further understanding of the disclosure and constitute a part of the disclosure. The accompanying drawings together with the following embodiments serve to explain the disclosure, but do not constitute a limitation to the disclosure. In the accompanying drawings.

Figure 1:
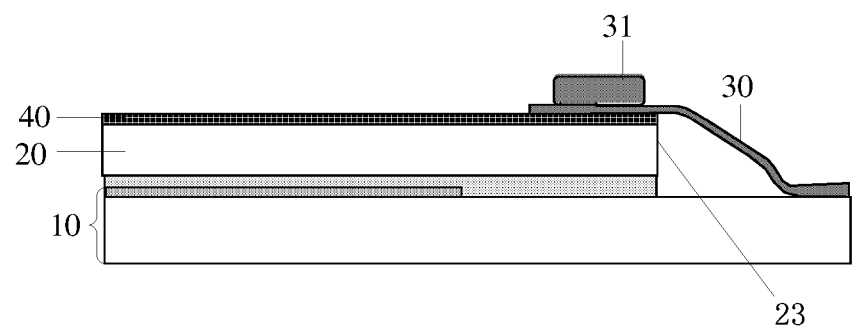
FIG. 1 is a sectional structure diagram of a display apparatus.

NUMERALS IN THE ACCOMPANYING DRAWINGS ARE 10 display substrate
11 array substrate
12 organic light emitting layers
20 package cover plate
201 first surface
201 second surface
21 groove
211 first groove wall
212 second groove wall
213 third groove wall
214 groove bottom
215 fourth groove wall
22 edge of the package cover plate
23 right-angle-edge of the package cover plate
24 frame region of the display substrate
25 display region of the display substrate
30 FPC
31 drivers IC
40 cushion gum layer
50 encapsulant layer
60 cutting line

DETAILED DESCRIPTION

The embodiments of the disclosure will be described below in detail with reference to the accompanying drawings in order that the objects, technical features and advantages are more clear and easy to understand. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

As shown in FIG. 1, a display apparatus comprises a display substrate 10, a package cover plate 20 arranged on the display substrate 10, and a plurality of FPCs (Flexible Printed Circuit) 30. One end of the FPC 30 is connected to the display substrate 10 in a manner of reverse bonding, on the other end of the FPC 30 there is arranged a driver IC 31 for driving the display substrate 10 to display contents, and the other end of the FPC 30 on which the driver IC 31 is attached is located on the package cover plate 20. The above display substrate 10 and the FPC 30 are connected with each other in a manner of reverse bonding, which avoids the bending and overturning in the FPC 30 in a manner of forward bonding. This can save the apace occupied by the bending and overturning in the FPC 30, and in turn makes the border of the display apparatus become narrower.

wherein, the material of the package cover plate 20 is mainly of glass, and the package cover plate 20 is thick, so the force received by the FPC 30 at the position contacting with the right-angle-edge 23 of the package cover plate 20 is large when the end of the FPC 30 on which a driver IC 31 is attached is arranged on the package cover plate 20. Thus, the FPC 30 is very easy to be scratched by the right-angle-edge 23 made from the material of glass. In order to solve this problem, a layer of cushion gum 40 is generally arranged on the package cover plate 20, then the FPC 30 is gonging to contact with the cushion gum 40 when it is located on the package cover plate 20, in turn the FPC 30 being scratched can be avoided.

But what is the disadvantage about the above structure is that, the thickness of the display apparatus increases due to the cushion gum layer 40; this may not meet the public's requirement of ultra-thinning for the display apparatus.

One embodiment of the disclosure provides a display apparatus will be described as follows, which is capable of protecting the FPC under the premise of not increasing the thickness of the display apparatus.

Figure 2:
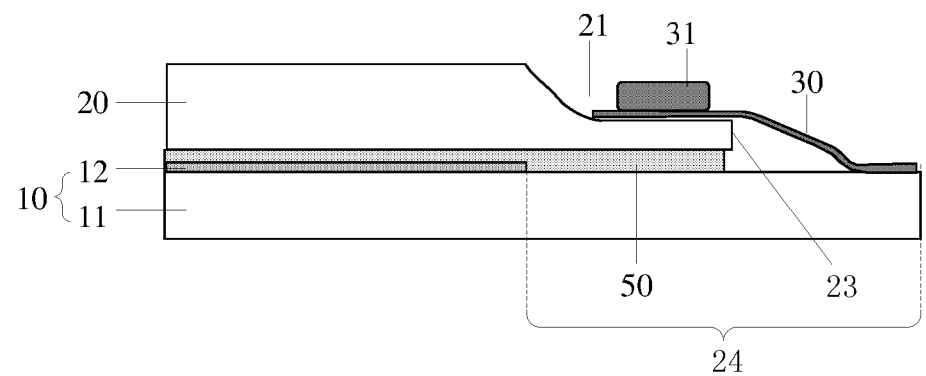
FIG. 2 is a first sectional structure diagram of the display apparatus according to one embodiment of the disclosure.
Figure 3:
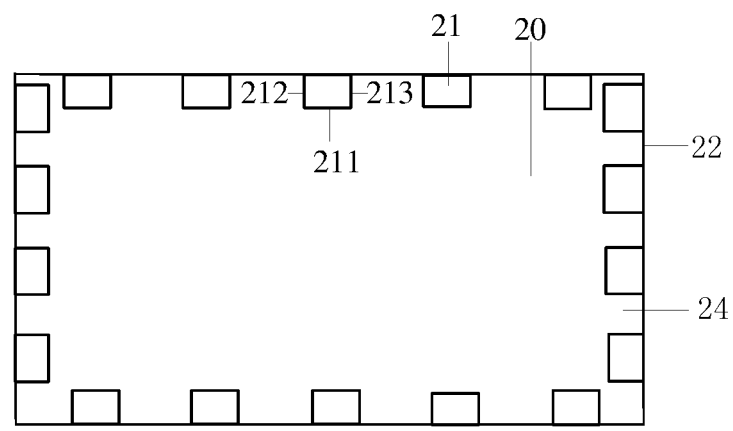
FIG. 3 is a first planar structure diagram of the package cover plate according to one embodiment of the disclosure.

As shown in FIG. 2 and FIG. 3, a display apparatus is provided in one embodiment of the disclosure. The display apparatus comprises a display substrate 10, a package cover plate 20 and a plurality of FPC 30, wherein the FPC 30 comprises a driver circuit of the display substrate 10 thereon; one end of the FPC 30 is connected to the display substrate 10, optionally to the wire on the display substrate 10, and on the other end there is arranged a driver IC 31; the package cover plate 20 is arranged on the surface of the display substrate 10 that is opposite to the display surface of the display apparatus, so as to protect the display substrate 10. A groove 21 is arranged at the edge 22 of the surface that is far away from the display substrate 10 of the package cover plate 20, and the opening direction of the groove 21 deviates from the display substrate 10; the groove 21 comprises three groove walls, which are the first groove wall 211, the second groove wall 212 and the third groove wall 213. The first groove wall 211 is located within the package cover plate 20, while the second groove wall 212 and the third groove wall 213 are arranged oppositely. One side of the second groove wall 212 is connected to one side of the first groove wall 211, the other side of the second groove wall 212 extends to the edge 22 of the package cover plate 20, accordingly one side of the third groove wall 213 is connected to the other side of the first groove wall 211, and the other side of the third groove wall 213 also extends to the edge 22 of the package cover plate 20. Thus, there is not any groove wall of the groove 21 at the edge 22 of the package cover plate, the end of the FPC on which the driver IC is arranged can be located within the groove 21 from the side of the groove 21 where there is no groove walls are arranged at the edge 22 of the package cover plate 20.

As for the display apparatus of the embodiment, the package cover plate 20 is arranged on the display substrate 10, and the groove 21 is arranged at the edge of the surface that is far away from the display substrate 10 of the package cover plate 20 so as to provide a placement space for the end of the FPC 30 on which the driver IC is attached. Thus, the thickness of the right-angle-edge 23 of the package cover plate 20 contacting with the FPC 30 is reduced and the ascending angle of the FPC 30 is small due to the groove 21 when the end of the FPC 30 on which the driver IC is attached is located within the groove 21, accordingly the force received by the FPC 30 at the position of the right-angle-edge 23 is small and the FPC 30 is not scratched by the right-angle-edge 23 made from the material of glass. It can be seen that the FPC 30 is effectively protected in the above display apparatus, and in turn the driver circuit on the FPC 30 is protected in a good condition. Furthermore, there is no gluing process of cushion gum layer 40 comparing to the display apparatus shown in FIG. 1, so the cost is reduced, and the situation of the product yield being reduced in the gluing process is avoided. And the most important thing is that the thickness of the display apparatus does not increase due to the groove 21.

The display apparatus provided by the embodiment also meet the following conditions: the opening direction of the groove 21 deviates from the display substrate 10, the driver IC 31 is arranged in the same position as that of an existing display apparatus when the end of the FPC 30 on which the driver IC 31 is arranged is located on the package cover plate 20, thus there is basically no bad influence about the driver function of the driver IC; the groove 21 is arranged at the edge 22 of the package cover plate 20, and this arrangement can keep away from the central region of the package cover plate 20 and thus can keep away from the display region of the display apparatus, so there is basically no bad influence about the display effect of the display apparatus. That is, it can be known from combining with the above two points that, the FPC 30 is protected and the thickness of the display apparatus does basically not increase under the premise that the basic function of the display apparatus can be achieved in the display apparatus of the embodiment.

Furthermore, the package cover plate 20 comprises a plurality of grooves 21. The number of the driver ICs 31 can be determined according to the actual situations for driving of the display substrate 10, and in turn the number of the grooves 21 can be determined. Optionally, the plurality of the grooves 21 may be arranged around the edge 22 of the surface that is far away from the display substrate 10 of the package cover plate 20.

The function of the package cover plate 20 in the display apparatus is mainly for packaging and protecting well the display substrate 10, thus each part of the package cover plate 20 should be able to meet the strength requirement of the packaging process. The position where the groove 21 is located in the package cover plate 20 can be as the optimum positions for testing the strength of the package cover plate 20, because at this position the thickness of the package cover plate 20 is basically smallest. Optionally, the thickness of the package cover plate 20 at this position may be about 0.1 mm to about 0.3 mm, that is, the distance from the groove bottom of the groove 21 to the surface that is close to the display substrate 10 of the package cover plate 20 is about 0.1 mm to about 0.3 mm. The strength of the package cover plate 20 at the position of the groove can hardly meet the required strength by the packaging process when it is lower than 0.1 mm, and the thickness of the right-angle-edge 23 where the groove contacts with the driver IC is large and the FPC 30 will be scratched when it is higher than 0.3 mm. Optionally, the distance from the groove bottom of the groove 21 to the surface that is close to the display substrate 10 of the package cover plate 20 is for example about 0.1 mm, about 0.2 mm or about 0.3 mm.

The connection part connecting the groove bottom and the groove wall of the groove 21 may be shaped in an arch shape, as shown in FIG. 2, so as that the FPC 30 cannot be scratched by the edges and corners of the glass within the groove 21 when the end of the FPC 30 on which the driver IC 31 is attached is arranged within the groove 21, and the display apparatus of the embodiment have been improved.

In this embodiment, the vertical projection of the groove 21 projected on the display substrate 10 may be located within a frame region 24 of the display substrate 10, then the influence of setting of the groove 21 to the display effects of the display apparatus can be further avoided.

An Organic Light Emitting Diode (for short, OLED) in the display technical field has a plurality of advantages, such as active luminousness, high brightness, high contrast, ultra-thinness, low power consumption, being able to flexibility and broad range of operating temperature, which is a kind of advanced and new mainstream display technology. The display apparatus in the embodiment may be an OLED display apparatus, optionally the display apparatus may be a bottom emission type OLED display apparatus. Hence, the display substrate 10 is an OLED display substrate. As shown in FIG. 2, the display substrate 10 may comprise the array substrate 11 and the organic light emitting layer 12 arranged on the array substrate 11, wherein the organic light emitting layer 12 comprises organic light emitting devices, and the package cover plate 20 which is arranged on the organic light emitting layer 12 can protect the organic light emitting devices.

As shown in FIG. 2, optionally, the encapsulant layer 50 may be arranged between the display substrate 10 and the package cover plate 20, in order that the package cover plate 20 on the display substrate 10 can be attached well and completely with the display substrate 10, also in order that the devices (for example, organic light emitting devices) within the display substrate 10 can be further isolated and protected.

Exemplarily, the encapsulant layer 50 between the display substrate 10 and the package cover plate 20 may adopt the form of sealant for packaging. That is, the sealant is set at the frame of the area between the display substrate 10 and the package cover plate 20, so that the encapsulant layer 50 can be formed. Furthermore, the filling agent may also be filled within the middle area formed by the sealant so as to form another kind of encapsulant layer 50; the encapsulant layer 50 may also adopt a form of surface package, that is, a layer of sealant is set in the area between the display substrate 10 and the package cover plate 20 so as to form the encapsulant layer 50.

It should note that, an organic thin film layer and a inorganic thin film layer can be piled on the display substrate 10 to achieve the aim of package except using the package cover plate 20 and the encapsulant layer 50 in the embodiment as packaging structures by the display apparatus.

Figure 4:
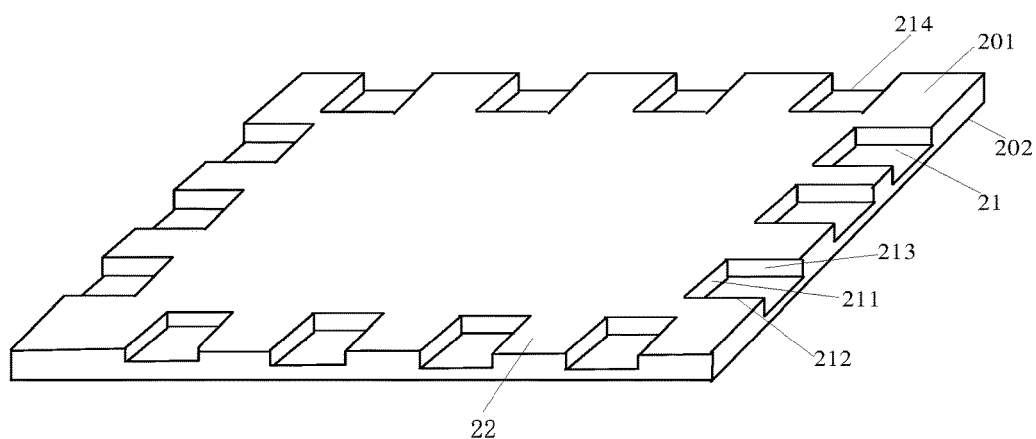
FIG. 4 is a first perspective structure diagram of the package cover plate according to one embodiment of the disclosure.

As shown in FIG. 4, another embodiment of the disclosure provides a package cover plate 20 which is applicable for the display apparatus in the above embodiment. The package cover plate 20 comprises a first surface and a second surface arranged oppositely, wherein one surface is called as the first surface 201 and the surface opposite to the first surface 201 is called as the second surface 202 in order for describing them easily. Wherein, the groove 21 is arranged at the edge 22 of the first surface 201, and the opening direction of the groove 21 deviates from the second surface 202. The groove 21 comprises the first groove wall 211 located within the package cover plate 20, and the second and third groove walls 212 and 213 which are arranged oppositely. As for the two corresponding sides of the second groove wall 212 and the third groove wall 213, one side of each of the second and third groove wall is connected to each of the two sides of the first groove wall 211, respectively, and the other side of each of the second groove wall 212 and the third groove wall 213 extends to the edge 22 of the package cover plate 20. Wherein, the first surface 201 is far away from the display substrate 10 when the package cover plate 20 is arranged on the display substrate 10, it is can be known form the combination of the above features.

The package cover plate 20 provided in this embodiment is applicable for the display apparatus of the above embodiment. The package cover plate 20 can be arranged on the surface of the display substrate 10 that deviates from the display surface. The end of the FPC 30 on which the driver IC 31 is attached is located within the groove 21 of the package cover plate 20, and the other end of the FPC 30 is connected with the display substrate 10. The right-angle-edge 23 of the package cover plate 20 of this embodiment becomes thinner due to the groove 21 comparing to the solution that the FPC 30 is protected by adding the cushion gum layer 40 in the display apparatus which is shown in FIG. 1, so the ascending angle of the FPC 30 becomes smaller when the right-angle-edge 23 contacts with the FPC 30, accordingly the force received by the FPC at the position of the right-angle-edge 23 becomes smaller, in turn the FPC 30 is basically not scratched by glass fins at the right-angle-edge 23 of the package cover plate 20, and thus the risk that the driver circuit in the FPC 30 can be avoided and the FPC 30 is protected; meanwhile the thickness of the display apparatus of the disclosure is basically not increased due to the setting of the groove 21, and this can make the display apparatus lighter and thinner.

The package cover plate 20 comprises a plurality of the grooves 21 in order to meet the requirement that the display substrate 10 need to be driven by a plurality of driver ICs 31, and the plurality of grooves 21 are arranged around the edge 22 of the first surface 201.

Optionally, the distance from groove bottom 214 of the groove 21 to the second surface 202 may be about 0.1 mm to about 0.3 mm, for example, about 0.1 mm, about 0.2 mm or about 0.3 mm, so that the strength requirement of the package cover plate 20 in the packaging process can be basically ensured.

Optionally, the connection part connecting the groove bottom 214 and the groove wall of the groove 21 is shaped in an arch shape, through which the FPC 30 can be protected further, so the FPC 30 being scratched by the right-angle-edge of the glass within the groove 21 is avoided.

Figure 5:
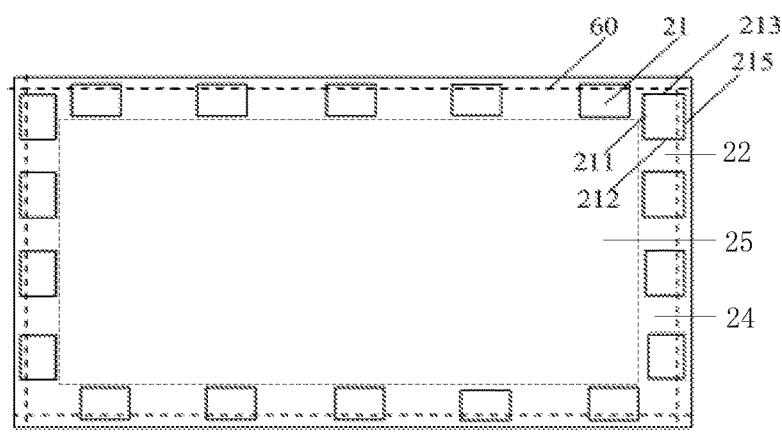
FIG. 5 is a second planar structure diagram of the package cover plate according to another embodiment of the disclosure.
Figure 6:
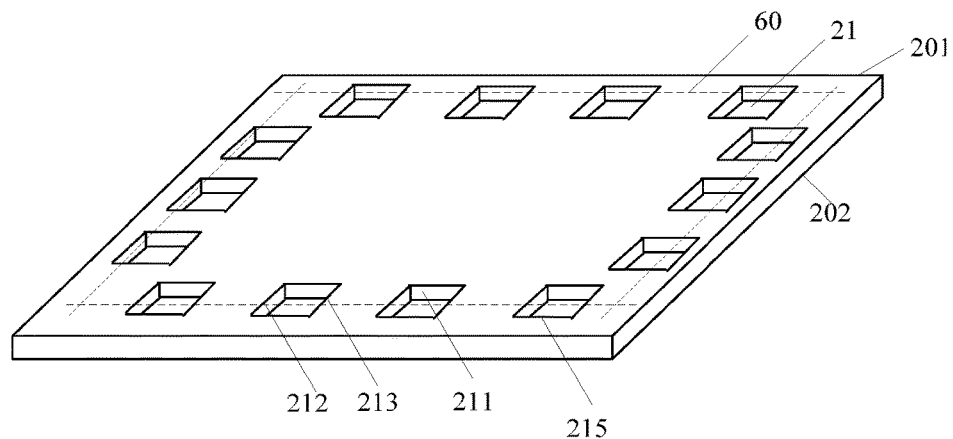
FIG. 6 is a second perspective structure diagram of the package cover plate according to another embodiment of the disclosure.
Figure 7:
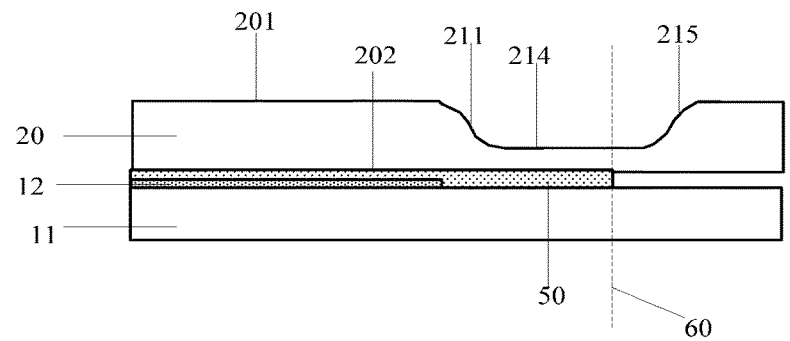
FIG. 7 is a second sectional structure diagram of the display apparatus according to another embodiment of the disclosure.

As an example, a method for manufacturing the above package cover plate is provided, and the method comprises the following steps:

As shown in FIG. 5~FIG. 7, firstly a cutting line 60 is located on the first surface 201 of the package cover plate 20;

And then the groove 21 is formed on and across the cutting line 60 by adopting a half-etching process, wherein the opening direction of the groove 21 deviated from the second surface 202, and the groove 21 comprises four groove walls connected in sequence. The groove wall that is close to the edge 22 of the package cover plate 20 and the groove wall that is far away from the edge 22 of the package cover plate 20 are located at each side of the cutting line, respectively;

At last, the package cover plate 20 is cut along the cutting line 60.

The opening direction of the groove 21 formed on the cutting line 60 deviates from the second surface 202 when the above method is adopted to manufacture the package cover plate 20. Meanwhile as for the two groove walls of the groove 21 which are arranged oppositely, wherein one groove wall is close to the edge 22 of the package cover plate 20, and the other one is far away from the edge 22 of the package cover plate 20, and one of them is located at one side of the cutting line 60, respectively. So that the groove wall that is close to the edge 22 of the package cover plate 20 (which is called as the fourth groove wall 215 for the convenience of description) will be cut off after the cutting is done along the cutting line, and in turn an opening is formed on the surface of the groove 21 where the fourth groove wall 215 is located. This opening is actually the edge 22 of the package cover plate 20, and the groove wall that is far away from the edge 22 of the package cover plate 20 is formed as the first groove wall 211, both of the groove walls that are connected to the first groove wall 211 and the fourth groove wall 215 are as the second groove wall 212 and the third groove wall 213 of this embodiment, respectively. Thus, the end of the FPC 30 on which the driver IC 31 is attached can be located within the groove 21 through the above opening. It can be seen that the above method is used for manufacturing the package cover plate 20 of the embodiment.

Further, the half-etching process can be adopted to form a plurality of grooves 21 along the cutting line 60 when the package cover plate 20 comprising a plurality of grooves 21 are manufactured.

Optionally, the above method for manufacturing the package cover plate may be combined with other steps for manufacturing the display apparatus to form the method for manufacturing the display apparatus of the above embodiment together.

As an example, before the manufacturing of the package cover plate 20, the following steps can be carried out firstly:

The organic light emitting layer 12 is formed on the array substrate 11, and the organic light emitting layer 12 comprises organic light emitting devices, so as that the manufacturing of the display substrate 10 can be completed;

The encapsulant layer 50 is formed on the organic light emitting layer 12;

The package cover plate 20 is arranged on the encapsulant layer 50, in order that the package cover plate 20 can be attached well with the display substrate 10.

And then, the steps of manufacturing the package cover plate 20 are started as follows:

As shown in FIG. 5~FIG. 7, the cutting line 60 is located on the first surface 201 of the package cover plate 20. The cutting line 60 can be located according to the positions of the display region 25 and the frame region 24 of the display substrate 10, so as that the groove 21 on the cutting line 60 has basically no bad influence on the display effects of the display region.

A plurality of grooves 21 can be formed along the cutting line 60 by adopting the half-etching process, and the opening direction of the groove 21 deviates from the second surface 202. The position of the groove 21 is corresponding to the locating position of the FPC 30, and one of the fourth groove wall 215 and the first groove wall 211 of the groove 21 is located at one side of the cutting line 60, respectively. Here the thickness of the groove 21 formed by the half-etching process may be: the distance from the groove bottom 214 to the second surface 202 is about 0.1 mm to about 0.3 mm, for example, about 0.1 mm, about 0.2 mm or about 0.3 mm.

As shown in FIG. 7, the connection part connecting the groove bottom 214 and each of the groove walls of the groove 21 may be shaped in an arch shape in this process.

Figure 8:
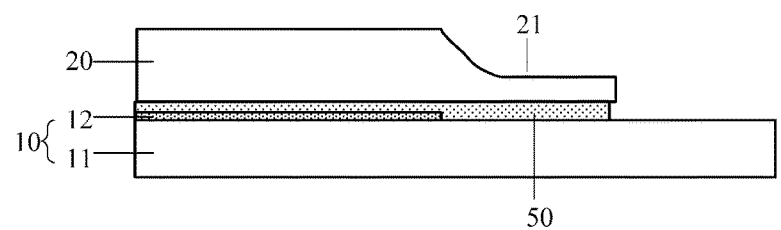
FIG. 8 is a third sectional structure diagram of the display apparatus according to further another embodiment of the disclosure.

As shown in FIG. 8, the fourth groove wall 215 may be cut off when the cutting is carried out along the cutting line 60. Optionally, a laser cutting process can be selected to cut the package cover plate 20.

After the step of manufacturing the package cover plate 20 is completed, the following steps can also be carried out: the end of the FPC 30 on which the driver IC is arranged is brought to go down into the groove 21, while the other end of the FPC 30 is connected to the display substrate 10 in the manner of reverse bonding (please see FIG. 1).

The display apparatus of the above embodiment can be obtained by combing the above manufacturing steps.

It is worth mentioning that, all of the beneficial effects of the above embodiments may be used for the explanation of the other embodiments.

It should be noted that, the type of the display apparatus provided by the above embodiment may be the types of liquid crystal, OLED (Organic Light-Emitting Diode) or electronic paper, and which are applicable for any product or component with the function of display, such as cell phones, Pads (Tablet PCs), televisions, display devices, notebook PCs, digital photo frames, navigators and so on.

Additional embodiments including any one of the embodiments described above may be provided by the disclosure, where one or more of its components, functionalities or structures is interchanged with, replaced by or augmented by one or more of the components, functionalities or structures of a different embodiment described above.

It can be understood that the above embodiments are merely illustrative embodiments, but the disclosure is not limited thereto. It will be apparent to those skilled in the art that various changes and modifications can be made therein without departing from the spirit and essence of the disclosure which are also considered to be within the scope of the disclosure. So the protective scope of the disclosure is defined by the claims.

What is claimed is:

1. A display apparatus, comprising a display substrate, a package cover plate arranged on the display substrate, and a plurality of FPCs (Flexible Printed Circuits), at one end of one of the plurality of FPCs there being arranged a driver IC, and the other end of the one of the plurality of FPCs being connected to the display substrate, wherein a groove is arranged at the edge of the surface that is far away from the display substrate of the package cover plate, and the opening direction of the groove deviates from the display substrate; the groove comprises a first groove wall, and second and third groove walls which are arranged oppositely, the first groove wall is located within the package cover plate and the two sides of which are connected to one side of each of the second and third groove walls, respectively, and the other side of each of the second and third groove walls extends to the edge of the package cover plate, respectively; the end of the one of the plurality of FPCs on which the driver IC is arranged is located within the groove.

2. The display apparatus according to claim 1, wherein, the distance from the groove bottom of the groove to the surface that is close to the display substrate of the package cover plate is about 0.1 mm to about 0.3 mm.

3. The display apparatus according to claim 1, wherein, the connection part connecting the groove bottom and the groove wall of the groove is shaped in an arch shape.

4. The display apparatus according to claim 1, wherein, the vertical projection of the groove projected on the display substrate is located within a frame region of the display substrate.

5. The display apparatus according to claim 1, wherein, the display substrate comprises an array substrate and an organic light emitting layer arranged between the array substrate and the package cover plate.

6. The display apparatus according to claim 1, wherein, an encapsulant layer is arranged between the display substrate and the package cover plate.

7. A package cover plate, which is applicable for the display apparatus according to claim 1 and comprises a first surface and a second surface arranged oppositely; a groove is formed in the first surface at an edge of the first surface, and the opening direction of the groove deviates from the second surface; the groove comprises a first groove wall, and a second and third groove wall which are arranged oppositely, wherein the first groove wall is located within the package cover plate and the two sides of which are connected to one side of each of the second and third groove walls, respectively, while the other side of each of the second and third groove walls extends to the edge of the package cover plate, respectively; the package cover plate comprises a plurality of grooves, the plurality of grooves are arranged around the edge of the first surface.

8. The package cover plate according to claim 7, wherein, the distance from the groove bottom of the groove to the second surface is about 0.1 mm to about 0.3 mm.

9. The package cover plate according to claim 7, wherein, the connection part connecting the groove bottom and the groove wall of the groove is shaped in an arch shape.

10. A method for manufacturing the display apparatus of claim 1, comprising:
    providing with a package cover plate which comprises a first surface and second surface arranged oppositely;
    locating a cutting line on the first surface of the package cover plate;
    forming a groove on and across the cutting line, wherein the opening direction of the groove deviates from the second surface, and the groove comprises four groove walls connected in sequence; the groove wall that is close to the edge of the package cover plate and the groove wall that is far away from the edge of the package cover plate are located at each side of the cutting line, respectively;
    cutting the package cover plate along the cutting line.

11. The method for manufacturing the display apparatus according to claim 10, wherein, the step of forming a groove on and across the cutting line comprises: forming a plurality of grooves on and across the cutting line by adopting a half-etching process.

12. The method for manufacturing the display apparatus according to claim 10, wherein, before the step of locating a cutting line on the first surface of the package cover plate, the method further comprises:

forming an organic light emitting layer on an array substrate so as to form a display substrate;

forming an encapsulant layer on the organic light emitting layer;

placing the package cover plate on the encapsulant layer, and letting the second surface of the package cover plate being attached on the display substrate.

13. The method for manufacturing the display apparatus according to claim 10, wherein, the step of cutting the package cover plate along the cutting line comprises: cutting the package cover plate by adopting a laser cutting process.

14. The method for manufacturing the display apparatus according to claim 10, wherein, after the step of cutting the package cover plate along the cutting line, the method further comprises:

letting the end of the FPC on which the driver IC is arranged go down into the groove, while the other end of the FPC being connected with the display substrate.

15. A display apparatus, comprising a display substrate, a package cover plate arranged on the display substrate, and a plurality of FPCs (Flexible Printed Circuits), at one end of one of the plurality of FPCs there being arranged a driver IC, and an opposite end of the one of the plurality of FPCs being connected to the display substrate, wherein the package cover plate comprises a plurality of grooves, each groove is arranged at an edge of a surface of the package cover plate far away from the display substrate, and an opening direction of the groove deviates from the display substrate; the groove comprises a first groove wall, and second and third groove walls which are arranged oppositely, the first groove wall is located within the package cover plate and two sides of which are connected to one side of each of the second and third groove walls, respectively, and another side of each of the second and third groove walls extends to an edge of the package cover plate, respectively; the end of the one of the plurality of FPCs on which the driver IC is arranged is located within the groove, wherein the plurality of grooves are arranged around the edge of the surface of the package cover plate far away from the display substrate.

16. The display apparatus according to claim 15, wherein, a distance from a groove bottom of the groove to a surface of the package cover plate close to the display substrate is about 0.1 mm to about 0.3 mm.

17. The display apparatus according to claim 15, wherein, a connection part connecting a groove bottom and a groove wall of the groove is shaped in an arch shape.

18. The display apparatus according to claim 15, wherein, a vertical projection of the groove projected on the display substrate is located within a frame region of the display substrate.

19. The display apparatus according to claim 15, wherein, the display substrate comprises an array substrate and an organic light emitting layer arranged between the array substrate and the package cover plate.

20. The display apparatus according to claim 15, wherein, an encapsulant layer is arranged between the display substrate and the package cover plate.

* * * * *